United States Patent
Fung et al.

(10) Patent No.: US 8,748,322 B1
(45) Date of Patent: Jun. 10, 2014

(54) SILICON OXIDE RECESS ETCH

(71) Applicant: Applied Materials, Inc., Santa Clara, CA (US)

(72) Inventors: Nancy Fung, Livermore, CA (US); David T. Or, Santa Clara, CA (US); Qingjun Zhou, San Jose, CA (US); Lina Zhu, San Jose, CA (US); Jeremiah T. Pender, San Jose, CA (US); Srinivas D. Nemani, Sunnyvale, CA (US); Sean S. Kang, San Ramon, CA (US); Sergey G. Belostotskiy, Santa Clara, CA (US); Chinh Dinh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/942,950

(22) Filed: Jul. 16, 2013

Related U.S. Application Data

(60) Provisional application No. 61/812,449, filed on Apr. 16, 2013.

(51) Int. Cl.
*H01L 21/302* (2006.01)
(52) U.S. Cl.
USPC ........... 438/710; 438/723; 438/727; 438/730; 438/743

(58) Field of Classification Search
USPC ........................ 438/710, 723, 727, 730, 743
See application file for complete search history.

(56) References Cited

U.S. PATENT DOCUMENTS

| | | | |
|---|---|---|---|
| 2004/0097088 A1* | 5/2004 | Kitayama et al. | 438/694 |
| 2008/0160210 A1* | 7/2008 | Yang et al. | 427/534 |
| 2008/0274299 A1* | 11/2008 | Chen et al. | 427/569 |
| 2011/0266252 A1* | 11/2011 | Thadani et al. | 216/17 |
| 2012/0009796 A1* | 1/2012 | Cui et al. | 438/711 |
| 2012/0211462 A1* | 8/2012 | Zhang et al. | 216/13 |

* cited by examiner

*Primary Examiner* — Binh X Tran
(74) *Attorney, Agent, or Firm* — Kilpatrick Townsend & Stockton LLP

(57) ABSTRACT

A method of etching silicon oxide from a trench is described which allows more homogeneous etch rates across a varying pattern on a patterned substrate. The method also provides a more rectilinear profile following the etch process. Methods include a sequential exposure of gapfill silicon oxide. The gapfill silicon oxide is exposed to a local plasma treatment prior to a remote-plasma dry etch which may produce salt by-product on the surface. The local plasma treatment has been found to condition the gapfill silicon oxide such that the etch process proceeds at a more even rate within each trench and across multiple trenches. The salt by-product may be removed by raising the temperature in a subsequent sublimation step.

19 Claims, 5 Drawing Sheets

SILICON OXIDE RECESS ETCH

CROSS-REFERENCES TO RELATED APPLICATIONS

This application claims the benefit of U.S. Prov. Pat. App. No. 61/812,449 filed Apr. 16, 2013, and titled "SILICON OXIDE RECESS ETCH," by Nancy Fung et al., the entire disclosure of which is hereby incorporated herein in its entirety by reference for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective to the first material. As a result of the diversity of materials, circuits and processes, etch processes have been developed with a selectivity towards a variety of materials.

A Siconi™ etch is a remote plasma assisted dry etch process which involves the simultaneous exposure of a substrate to fluorine and hydrogen-based plasma by-products. Remote plasma excitation of the hydrogen and fluorine species allows plasma-damage-free substrate processing. The Siconi™ etch is largely conformal and selective towards silicon oxide layers but does not readily etch silicon regardless of whether the silicon is amorphous, crystalline or polycrystalline. The selectivity provides advantages for applications such as shallow trench isolation (STI) and inter-layer dielectric (ILD) recess formation.

Such etch processing steps have been used to trim silicon oxide uniformly back inside trenches. Etch processes used until now may result in trench recess variations within trenches and between separate trenches.

Methods are needed to provide greater uniformity of silicon oxide dry etch processes.

BRIEF SUMMARY OF THE INVENTION

A method of etching silicon oxide from a trench is described which allows more homogeneous etch rates across a varying pattern on a patterned substrate. The method also provides a more rectilinear profile following the etch process. Methods include a sequential exposure of gapfill silicon oxide. The gapfill silicon oxide is exposed to a local plasma treatment prior to a remote-plasma dry etch which may produce salt by-product on the surface. The local plasma treatment has been found to condition the gapfill silicon oxide such that the etch process proceeds at a more even rate within each trench and across multiple trenches. The salt by-product may be removed by raising the temperature in a subsequent sublimation step.

Embodiments of the invention include methods of etching gapfill silicon oxide from a narrow trench on a patterned substrate in a substrate processing region of a substrate processing chamber. The methods include flowing a treatment gas into the substrate processing region, forming a plasma from the treatment gas in the substrate processing region to treat the patterned substrate, combining a hydrogen-containing precursor and a fluorine-containing precursor in a remote plasma region while forming a remote plasma in the remote plasma region to form plasma effluents, flowing the plasma effluents into the substrate processing region, and etching the gapfill silicon oxide below the top of the trench.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

A method of etching silicon oxide from a trench is described which allows more homogeneous etch rates across a varying pattern on a patterned substrate. The method also provides a more rectilinear profile following the etch process. Methods include a sequential exposure of gapfill silicon oxide. The gapfill silicon oxide is exposed to a local plasma treatment prior to a remote-plasma dry etch which may produce salt by-product on the surface. The local plasma treatment has been found to condition the gapfill silicon oxide such that the etch process proceeds at a more even rate within each trench and across multiple trenches. The salt by-product may be removed by raising the temperature in a subsequent sublimation step.

Figure 1A:
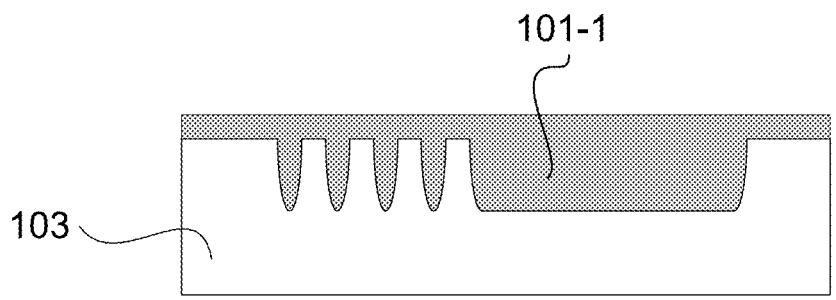
FIG. 1A is a schematic of silicon oxide gapfill prior to a silicon oxide recess operation.
Figure 1B:
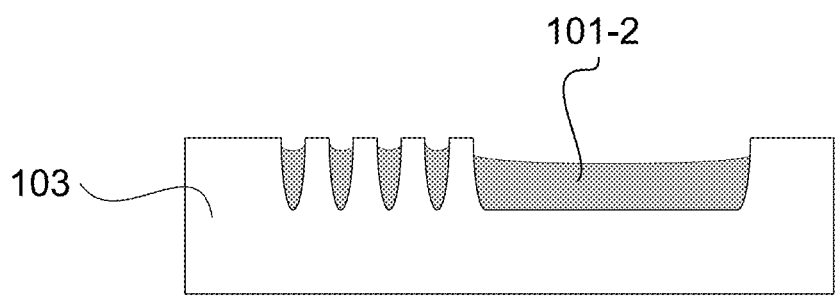
FIG. 1B is a schematic of silicon oxide gapfill following a silicon oxide recess operation.

Siconi™ etch processes are an example of a selective dry etch process and have used a hydrogen source such as ammonia ($NH_3$) in combination with a fluorine source such as nitrogen trifluoride ($NF_3$). The combination flows into a remote plasma system (RPS) and the plasma effluents created therein are flowed into a substrate processing region. The effluents can be used to etch (or "recess") gapfill silicon oxide in a controlled manner to form salt by-products on the etched silicon oxide surface. The salt by-products may then be sublimated from the surface to complete the etch process. FIG. 1A is a schematic of silicon oxide gapfill prior to a silicon oxide recess operation. The result of a prior art recess etch is shown in FIG. 1B. Trenches in patterned substrate 103 are shown with gapfill silicon oxide before 101-1 and after 101-2 the recess etch. As shown, a thickness variation may be observed along the gapfill silicon oxide surface within a gap or between gaps of different widths. The thickness variation may manifest itself as a "height" difference. By including a local plasma treatment of the gapfill silicon oxide, the inventors have found that the inter-trench and intra-trench variability of silicon oxide thickness can be substantially reduced and, at times, substantially eliminated using process parameters and gases as will be described in detail herein. Certain gases and process parameters have also been found to be effective while also avoiding erosion of the material which forms the walls of the trench(es).

Figure 2:
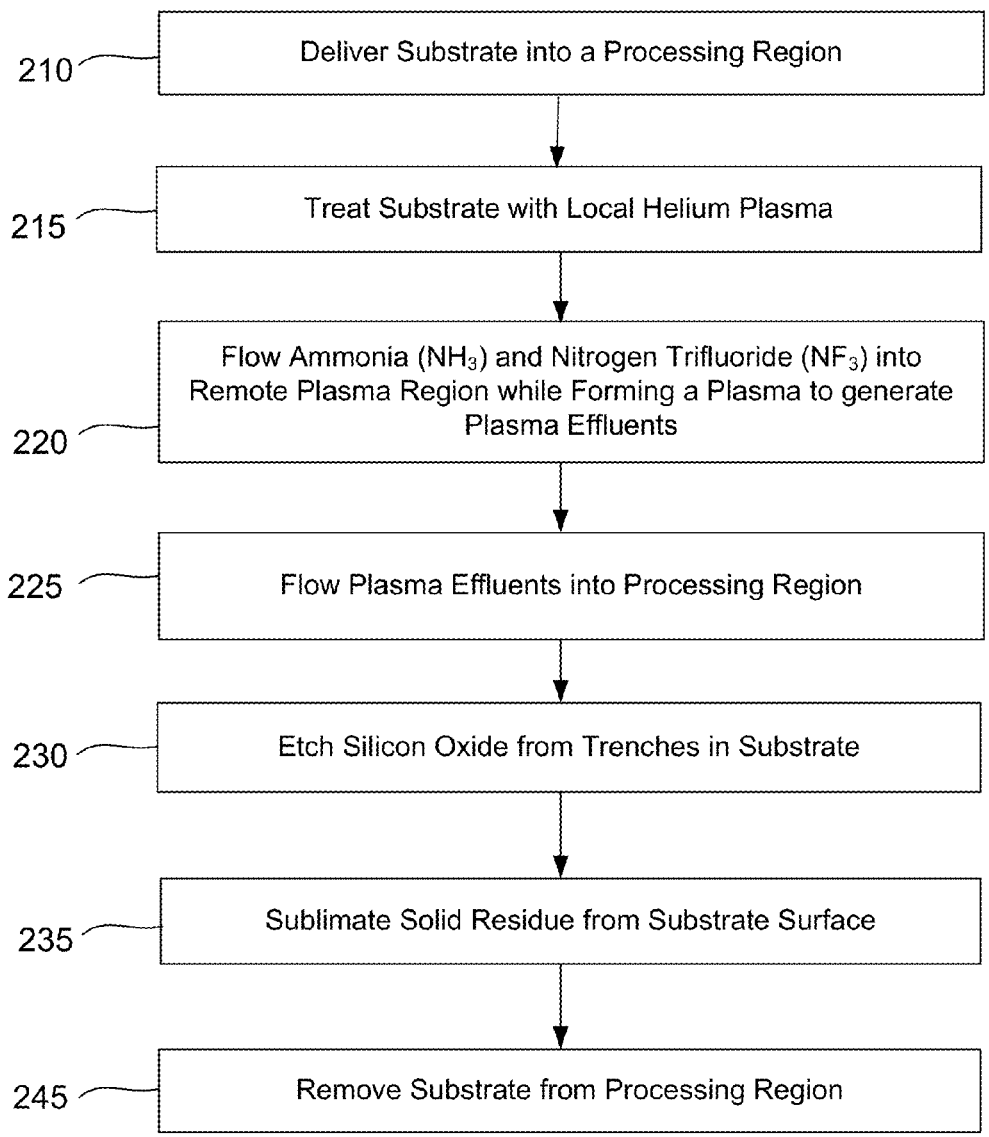
FIG. 2 is a flowchart of a silicon oxide process according to disclosed embodiments.
Figure 3A:
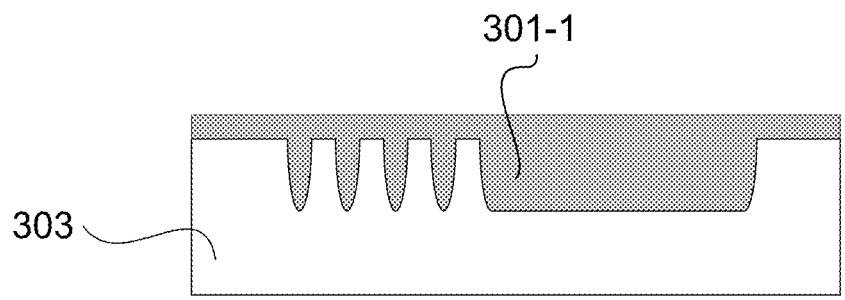
FIG. 3A is a schematic of silicon oxide gapfill prior to a silicon oxide recess operation.
Figure 3B:
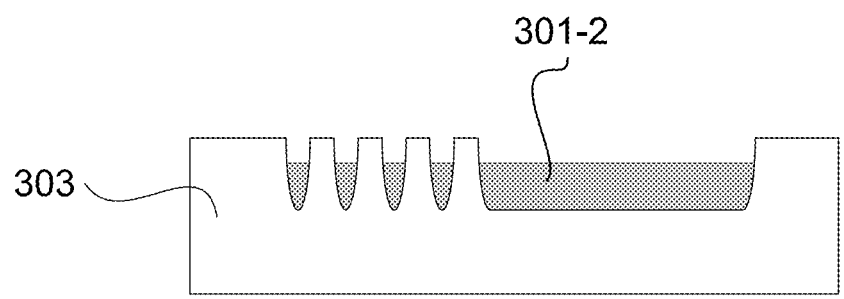
FIG. 3B is a schematic of silicon oxide gapfill following a silicon oxide recess operation according to disclosed embodiments.

In order to better understand and appreciate the invention, reference is now made to FIG. 2 which is a flow chart of a dry etch process, according to disclosed embodiments, applied to a patterned substrate having gapfill silicon oxide. The process begins when a patterned substrate having trenches of varying widths formed in a silicon substrate material is transferred into a substrate processing region (operation 210). Concurrent reference will also be made to FIG. 3A and FIG. 3B, which are schematics depicting the silicon oxide gapfill before and after the silicon oxide recess etch represented in FIG. 2. The gapfill silicon oxide 301-1 within trenches in the silicon substrate 303 is shown prior to the silicon oxide recess etch in FIG. 3A, while the gapfill silicon oxide 301-2 after the etch is shown in FIG. 3B.

Helium is flowed into the substrate processing region and a local plasma is initiated to treat the patterned substrate 303 having trenches filled with gapfill silicon oxide 301-1 (operation 210). The plasma is a capacitively coupled plasma formed by applying RF power between the substrate and a parallel plate disposed above the patterned substrate. The parallel plate may be a showerhead which will subsequently be used to conduct the etchants into the substrate processing region. Once the gapfill silicon oxide 301-1 has been treated with the helium plasma, the gapfill silicon oxide 301-1 is etched in the following manner. Flows of ammonia and nitrogen trifluoride are directed into a plasma region separate from the processing region (operation 220). The separate plasma region may be referred to as a remote plasma region herein. The remote plasma region may be a region within the substrate processing chamber and may be separated from the substrate processing region by the showerhead. However, the remote plasma region may be a remote plasma system exterior to the substrate processing chamber. Regardless of the physical configuration of the remote plasma, plasma effluents are formed in the remote plasma region from the mixture of ammonia and nitrogen trifluoride. The plasma effluents are then directed into the substrate processing region (operation 225) and react with the silicon oxide to form salt by-products, thereby etching the gapfill silicon oxide (operation 230).

During the preceding operations, the temperature of the patterned substrate is maintained at a relatively low level in order to ensure the salt by-products remain on the surface. The temperature of the patterned substrate throughout the sequence of operations 220-230 may be below one of 120° C., 105° C., 90° C., 80° C., 70° C., 60° C., 50° C., 40° C. or 35° C., in disclosed embodiments. The inventors have found that the same substrate temperature ranges may be used during the treatment of the gapfill silicon oxide in operation 215. The substrate is heated after operation 230 in order to sublimate the salt by-products (operation 235). The temperature of the solid residue and the silicon oxide may be raised above one of 90° C., 100° C., 120° C. or 140° C. during the sublimation, in disclosed embodiments. The duration of the sublimation may be above one of 45 seconds, 60 seconds, 75 seconds, 90 seconds or 120 seconds, in disclosed embodiments. Following sublimation, the patterned substrate is removed from the substrate processing region (operation 245).

In general, a variety of precursors may be flowed into the substrate processing region or the remote plasma region to create the plasma effluents as described herein. Another fluorine-containing precursor may be used to augment or replace the nitrogen trifluoride used in the examples discussed above. The fluorine-containing precursor may include one or more of nitrogen trifluoride, hydrogen fluoride, diatomic fluorine, monatomic fluorine and fluorine-substituted hydrocarbons. Similarly, a hydrogen-containing precursor may be used to augment or replace the ammonia used in the examples discussed previously. The hydrogen-containing precursor may include one or more of atomic hydrogen, molecular hydrogen and ammonia. The hydrogen-containing precursor may be fluorine-free and the fluorine-containing precursor may be hydrogen-free.

Operations 215-235 may be repeated an integral number of times to remove a selectable amount of material (i.e. removing a target thickness). One or each cycle of the etch (operations 215-235) removes between 5 nm and 75 nm, between 10 nm and 50 nm or between 15 nm and 40 nm of silicon oxide from the substrate in disclosed embodiments. A desirable aspect of the process described and claimed herein is that the claimed etch removes a very similar amount of material across the substrate (see FIG. 3B) regardless of trench width or other factors. As will be described in detail shortly, plasma treatments (especially those using helium) appear to process deeply into the gapfill silicon oxide, however, applying a repetitive treatment ensures that the linear etch removal rate exhibits unprecedented uniformity.

Additional silicon oxide dry etch process parameters are disclosed in the course of describing an exemplary processing system.

Exemplary Processing System

Figure 4:
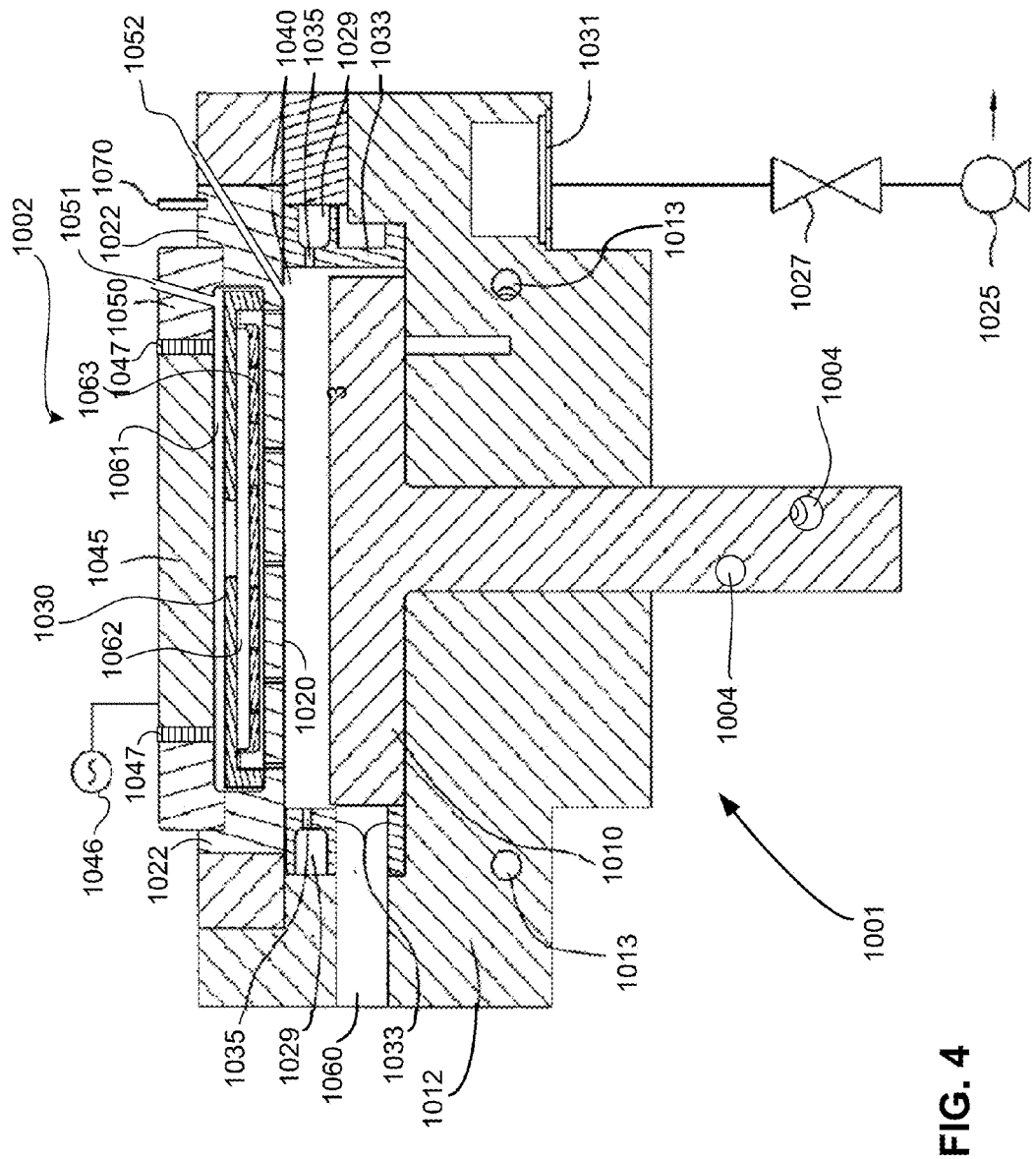
FIG. 4 is a cross-sectional view of a processing chamber for performing etch processes according to disclosed embodiments.

FIG. 4 is a partial cross sectional view showing an illustrative processing chamber 1001, in which, embodiments of the invention may be carried out. Processing chamber is configured to create a plasma in processing region 1040 during one stage of substrate processing designed to treat the substrate surface. Processing chamber 1001 is further configured to create a plasma above gas delivery plate 1020 (in remote plasma region(s) 1061-1063) during the etch process. During the etch process, a hydrogen-containing precursor and a fluorine-containing precursor are introduced through one or more apertures 1051 into remote plasma region(s) 1061-1063.

In one embodiment, the processing chamber 1001 includes a chamber body 1012, a lid assembly 1002, and a support assembly 1010. The lid assembly 1002 is disposed at an upper end of the chamber body 1012, and the support assembly 1010 is at least partially disposed within the chamber body 1012. The processing chamber 1001 and the associated hardware are preferably formed from one or more process-compatible materials (e.g. aluminum, stainless steel, etc.).

Figure 5:
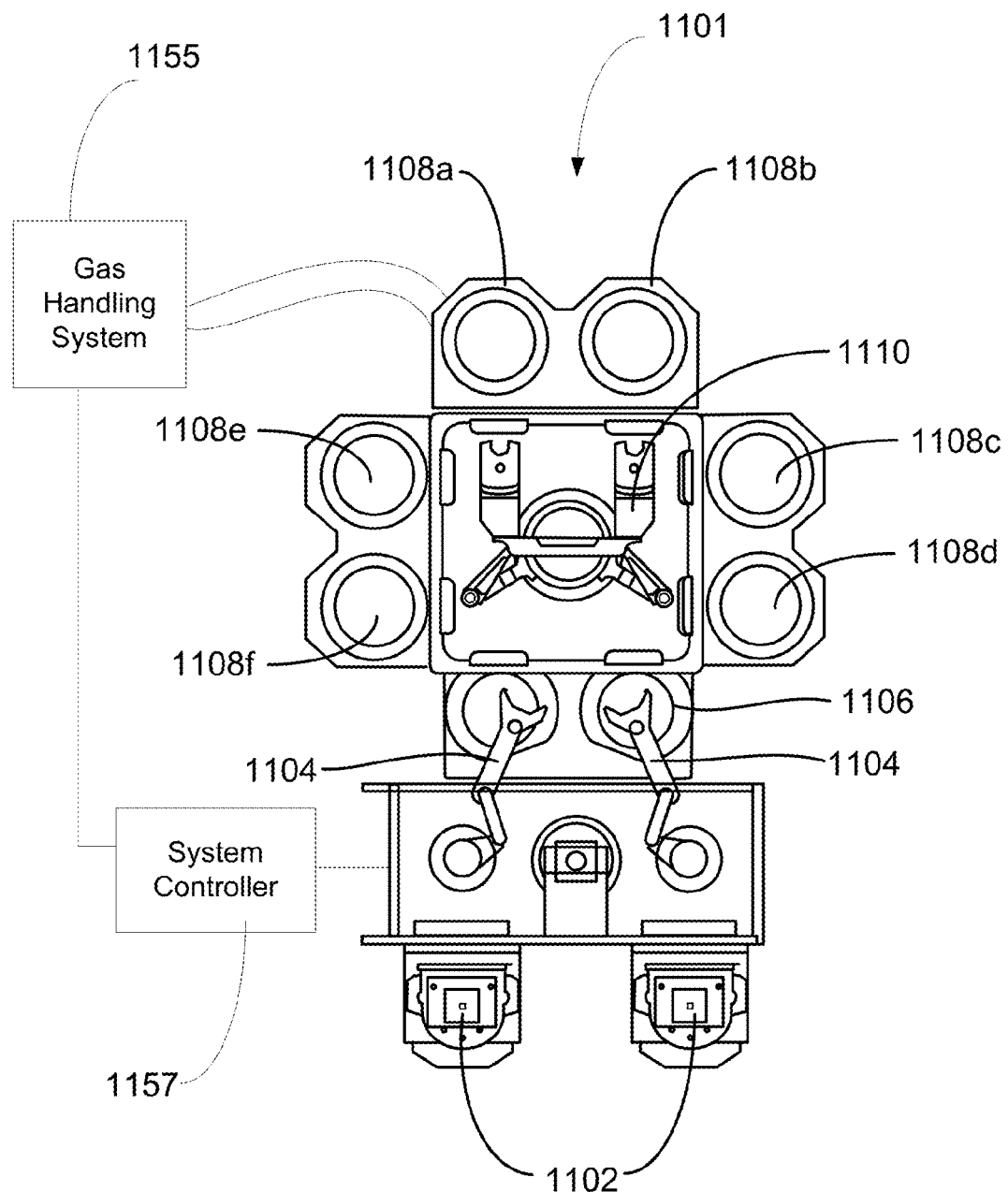
FIG. 5 is a processing system for performing etch processes according to disclosed embodiments.

The chamber body 1012 includes a slit valve opening 1060 formed in a sidewall thereof to provide access to the interior of the processing chamber 1001. The slit valve opening 1060 is selectively opened and closed to allow access to the interior of the chamber body 1012 by a wafer handling robot (not shown). In one embodiment, a wafer can be transported in and out of the processing chamber 1001 through the slit valve opening 1060 to an adjacent transfer chamber and/or load-lock chamber, or another chamber within a cluster tool. An exemplary cluster tool which may include processing chamber 1001 is shown in FIG. 5 and will be described shortly.

In one or more embodiments, chamber body 1012 includes a chamber body channel 1013 for flowing a heat transfer fluid through chamber body 1012. The heat transfer fluid can be a heating fluid or a coolant and is used to control the temperature of chamber body 1012 during processing and substrate transfer. Heating the chamber body 1012 may help to prevent unwanted condensation of the gas or byproducts on the chamber walls. Exemplary heat transfer fluids include water, ethylene glycol, or a mixture thereof. An exemplary heat transfer fluid may also include nitrogen gas. Support assembly 1010 may have a support assembly channel 1004 for flowing a heat transfer fluid through support assembly 1010 thereby affecting the substrate temperature.

The chamber body 1012 can further include a liner 1033 that surrounds the support assembly 1010. The liner 1033 is preferably removable for servicing and cleaning The liner 1033 can be made of a metal such as aluminum, or a ceramic material. However, the liner 1033 can be any process compatible material. The liner 1033 can be bead blasted to increase the adhesion of any material deposited thereon, thereby preventing flaking of material which results in contamination of the processing chamber 1001. In one or more embodiments, the liner 1033 includes one or more apertures 1035 and a pumping channel 1029 formed therein that is in fluid communication with a vacuum system. The apertures 1035 provide a flow path for gases into the pumping channel 1029, which provides an egress for the gases within the processing chamber 1001.

The vacuum system can include a vacuum pump 1025 and a throttle valve 1027 to regulate flow of gases through the processing chamber 1001. Vacuum pump 1025 may be a combination of vacuum pumps (e.g. a turbomolecular pump in combination with a mechanical rotary vane pump) in order to achieve a lower base pressure. The vacuum pump 1025 is coupled to a vacuum port 1031 disposed on the chamber body 1012 and therefore, in fluid communication with the pumping channel 1029 formed within the liner 1033. The terms "gas" and "gases" are used interchangeably, unless otherwise noted, and refer to one or more reactants, catalysts, carrier, purge, cleaning, combinations thereof, as well as any other fluid introduced into the chamber body 1012. The term "precursor" is used to refer to any process gas which takes part in a reaction to either remove or deposit material from a surface.

Apertures 1035 allow the pumping channel 1029 to be in fluid communication with a substrate processing region 1040 within the chamber body 1012. The substrate processing region 1040 is defined by a lower surface of the lid assembly 1002 and an upper surface of the support assembly 1010, and is surrounded by the liner 1033. The apertures 1035 may be uniformly sized and evenly spaced about the liner 1033. However, any number, position, size or shape of apertures may be used, and each of those design parameters can vary depending on the desired flow pattern of gas across the substrate receiving surface as is discussed in more detail below. In addition, the size, number and position of the apertures 1035 are configured to achieve uniform flow of gases exiting the processing chamber 1001. Further, the aperture size and location may be configured to provide rapid or high capacity pumping to facilitate a rapid exhaust of gas from the chamber 1001. For example, the number and size of apertures 1035 in close proximity to the vacuum port 1031 may be smaller than the size of apertures 1035 positioned farther away from the vacuum port 1031.

A gas supply panel (not shown) is typically used to provide process gas(es) to the processing chamber 1001 through one or more apertures 1051. The particular gas or gases that are used depend upon the process or processes to be performed within the chamber 1001. Illustrative gases can include, but are not limited to one or more precursors, reductants, catalysts, carriers, purge, cleaning, or any mixture or combination thereof. Typically, the one or more gases introduced to the processing chamber 1001 flow into plasma volume 1061 through aperture(s) 1051 in top plate 1050. Alternatively or in combination, processing gases may be introduced more directly through aperture(s) 1052 into substrate processing region 1040. Aperture(s) 1052 bypass the remote plasma excitation and are useful for processes involving gases that do not require plasma excitation or processes which do not benefit from additional excitation of the gases. Substrate treatment may use aperture(s) 1052 to deliver plasma gases for local plasma excitation in processing region 1040. Electronically operated valves and/or flow control mechanisms (not shown) may be used to control the flow of gas from the gas supply into the processing chamber 1001. Depending on the process, any number of gases can be delivered to the processing chamber 1001, and can be mixed either in the processing chamber 1001 or before the gases are delivered to the processing chamber 1001.

The lid assembly 1002 can further include an electrode 1045 to generate a plasma of reactive species within the lid assembly 1002. In one embodiment, the electrode 1045 is supported by top plate 1050 and is electrically isolated therefrom by inserting electrically isolating ring(s) 1047 made from aluminum oxide or any other insulating and process compatible material. In one or more embodiments, the electrode 1045 is coupled to a power source 1046 while the rest of lid assembly 1002 is connected to ground. Accordingly, a plasma of one or more process gases can be generated in remote plasma region composed of volumes 1061, 1062 and/or 1063 between electrode 1045 and annular mounting flange 1022. In embodiments, annular mounting flange 1022 comprises or supports gas delivery plate 1020. For example, the plasma may be initiated and maintained between electrode 1045 and one or both blocker plates of blocker assembly 1030. Alternatively, the plasma can be struck and contained between the electrode 1045 and gas delivery plate 1020, in the absence of blocker assembly 1030. In either embodiment, the plasma is well confined or contained within the lid assembly 1002. Accordingly, the plasma is a "remote plasma" since no active plasma is in direct contact with the substrate disposed within the chamber body 1012. As a result, plasma damage to the substrate may be avoided since the plasma is separated from the substrate surface.

A local plasma in processing region 1040 is initiated by using the same or another power source similar to power source 1046. In this case, the power may be delivered between annular mounting flange 1022 and support assembly 1010.

Accordingly, a plasma of one or more process gases (e.g. an inert gas) can be generated in processing region 1040. The plasma is well confined or contained within processing region 1040. Accordingly, the plasma is a "local plasma" since an active plasma is in direct contact with the substrate disposed within the chamber body 1012. An inert gas, which may include helium, may be delivered through aperture(s) 1051 and/or aperture(s) 1052 so long as the inert gas passes into processing region 1040 to be excited in the local plasma. The local plasma may be used during a pre-treatment step to prepare gapfill silicon oxide for etching using the remote plasma.

A wide variety of power sources 1046 are capable of activating the hydrogen-containing precursor (e.g. ammonia) and the nitrogen-containing precursor (nitrogen trifluoride). For example, radio frequency (RF), direct current (DC), or microwave (MW) based power discharge techniques may be used. Microwave frequencies are simply a subset of radio frequencies. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into the chamber 1001. Exemplary remote plasma generators are available from vendors such as MKS Instruments, Inc. and Advanced Energy Industries, Inc. In the exemplary processing system an RF power supply is coupled to electrode 1045. A higher-power microwave power source 1046 is beneficial in the event that reactive oxygen will also be produced using power source 1046.

The temperatures of the process chamber body 1012 and the substrate may each be controlled by flowing a heat transfer medium through chamber body channel 1013 and support assembly channel 1004, respectively. Support assembly channel 1004 may be formed within support assembly 1010 to facilitate the transfer of thermal energy. Chamber body 1012 and support assembly 1010 may be cooled or heated independently. For example, a heating fluid may be flown through one while a cooling fluid is flown through the other.

Other methods may be used to control the substrate temperature. The substrate may be heated by heating the support assembly 1010 (or a portion thereof, such as a pedestal) with a resistive heater or by some other means. In another configuration, gas delivery plate 1020 may be maintained at a temperature higher than the substrate and the substrate can be elevated in order to raise the substrate temperature. In this case the substrate is heated radiatively or by using a gas to conduct heat from gas delivery plate 1020 to the substrate. The substrate may be elevated by raising support assembly 1010 or by employing lift pins.

During the etch processes and/or the treatment processes described herein, chamber body 1012 may be maintained within an approximate temperature range of between 50° C. and 120° C., between 50° C. and 90° C., between 55° C. and 85° C. or between 60° C. and 80° C. in disclosed embodiments. During exposure to precursors (including for example plasma effluents and oxidizing agents), the substrate may be maintained below the temperatures given previously, between about 30° C. and about 120° C. or between 30° C. and 40° C. in disclosed embodiments.

Plasma effluents include a variety of molecules, molecular fragments and ionized species. Currently entertained theoretical mechanisms of prior art Siconi™ etching may or may not be entirely correct but plasma effluents are thought to include $NH_4F$ and $NH_4F.HF$ which react readily with low temperature substrates described herein. Plasma effluents may react with a silicon oxide surface to form $(NH_4)_2SiF_6$, $NH_3$ and $H_2O$ products. The $NH_3$ and $H_2O$ are vapors under the processing conditions described herein and may be removed from substrate processing region 1040 by vacuum pump 1025. A thin continuous or discontinuous layer of $(NH_4)_2SiF_6$ salt by-products is left behind on the substrate surface.

Following exposure to plasma effluents and the associated accumulation of salt by-products, the substrate may be heated to remove the salt by-products. In embodiments, the gas delivery plate 1020 is heatable by incorporating heating element 1070 within or near gas delivery plate 1020. The substrate may be heated by reducing the distance between the substrate and the heated gas delivery plate. The gas delivery plate 1020 may be heated to between about 100° C. and 200° C., between about 100° C. and 150° C., between about 110° C. and 140° C. or between about 120° C. and 130° C. in disclosed embodiments. By reducing the separation between the substrate and the heated gas delivery plate, the substrate may be heated to above about 75° C., above about 90° C., above about 100° C. or between about 115° C. and about 150° C. in disclosed embodiments. The heat radiated from gas delivery plate 1020 to the substrate should be made sufficient to dissociate or sublimate solid $(NH_4)_2SiF_6$ on the substrate into volatile $SiF_4$, $NH_3$ and HF products which may be pumped away from substrate processing region 1040. Other methods of imparting heat to the substrate may also be used.

Nitrogen trifluoride (or another fluorine-containing precursor) may be flowed into remote plasma volume 1061 at rates between about 25 sccm and about 200 sccm, between about 50 sccm and about 150 sccm or between about 75 sccm and about 125 sccm in disclosed embodiments. Ammonia (or hydrogen-containing precursors in general) may be flowed into remote plasma volume 1061 at rates between about 50 sccm and about 300 sccm, between about 75 sccm and about 250 sccm, between about 100 sccm and about 200 sccm or between about 120 sccm and about 170 sccm in disclosed embodiments.

Combined flow rates of hydrogen-containing and fluorine-containing precursors into the remote plasma region may account for 1% to about 70% by volume of the overall gas mixture; the remainder being a carrier gas. In one embodiment, a purge or carrier gas is first initiated into the remote plasma region before those of the reactive gases to stabilize the pressure within the remote plasma region.

Production of plasma effluents occurs within volumes 1061, 1062 and/or 1063 by applying plasma power to electrode 1045 relative to the rest of lid assembly 1002. Plasma power can be a variety of frequencies or a combination of multiple frequencies. In the exemplary processing system the plasma is provided by RF power delivered to electrode 1045. The RF power may be between about 1 watt and about 1000 watts, between about 5 watts and about 600 watts, between about 10 watts and about 300 watts or between about 20 watts and about 100 watts in disclosed embodiments. The RF frequency applied in the exemplary processing system may be less than about 200 kHz, less than about 150 kHz, less than about 120 kHz or between about 50 kHz and about 90 kHz in embodiments of the invention.

The local plasma used for substrate treatment is generated in processing region 1040 by applying local plasma power to annular mounting flange 1022 relative to support assembly 1010. The local plasma may use relatively low powers similar to the remote plasma powers given above. In addition to those frequencies given previously, the RF frequencies used to excite the local plasma may include frequencies between 1 MHz and 100 MHz (e.g. 13.56 MHz). The RF power may be between about 1 watt and about 600 watts, between about 20 watts and about 400 watts or between about 50 watts and about 250 watts in disclosed embodiments. The RF power may be pulsed to suppress erosion of desirable features while maintaining ability to modify the gapfill silicon oxide. The plasma may be pulsed at frequencies between 100 Hz and about 10 kHz or between 300 Hz and about 3 kHz in disclosed embodiments. The duty cycle of the plasma pulses may be between about 5% and about 50% or between about 10% and about 30% (e.g. 20%) in embodiments of the invention.

The exemplary plasmas described thus far have been capacitively coupled plasmas (CCP) formed by applying RF power between the substrate and a showerhead disposed above the patterned substrate (the local plasma) or between the showerhead and the top of the substrate processing chamber (the remote plasma). Using a CCP to excite the local plasma will cause some ionic bombardment of the substrate by treatment gas ions (e.g. He+). Ionic bombardment can be increased by adding an additional direct current (DC) power between the showerhead and the substrate. The substrate may be held near ground and the showerhead may be at an elevated potential or the substrate may be at a negative potential and the showerhead may be held near ground in disclosed embodiments. Regardless of configuration, the relative DC bias offset may be between 100 V and 4 kV, between 300 V and 2 kV or between 500 V and 1 kV in embodiments of the invention.

Systems for carrying out the methods disclosed herein may also be designed which rely on inductively coupled plasmas in disclosed embodiments. In this case, the ionized species created from the treatment gas in the ICP plasma may be accelerated toward the substrate with an AC, DC or AC+DC power supplied between the showerhead and the substrate. The power levels and frequencies for both CCP and ICP plasma sources are the same, in embodiments, as the parameters given previously.

The inventors have discovered that using helium provides great efficacy in treating the gapfill silicon oxide while simultaneously limiting the damage done to the walls of the trenches. This is especially desirable when the walls of the trench are formed in crystalline silicon as is the case for shallow trench isolation and, more specifically, the production of finFETs. In disclosed embodiments, the patterned substrate consists only of silicon. Avoiding sputtering or other damage to the crystalline silicon improves or enables device performance. Other gases were used such as argon, molecular hydrogen, molecular nitrogen and the like. These other gases were effective components of the local plasma and had some desirable effects on evening out the removal rate of the gapfill silicon oxide. Heavier plasma constituents, such as argon and molecular nitrogen, were found to be more likely to damage the sidewall silicon which formed the trenches in the dense or open areas. Molecular nitrogen also may have modified some of the chemistry within the gapfill silicon oxide since it introduces some nitrogen to the film. Similarly, molecular hydrogen was found to be not as effective as helium, perhaps due to some of the same effects. It appears that the efficacy is not simply due to a light mass effect, or at least the benefits of having a low atomic mass are convolved with the deficit of causing a covalent chemical reaction within the film. However, all plasma treatments displayed some beneficial effect. The treatment gas includes at least one of ammonia, molecular nitrogen, argon, neon, helium or molecular hydrogen, in disclosed embodiments. Preferably, the treatment gas comprises helium or consists only of helium, in disclosed embodiments.

Pulsing the local treatment plasma power was found to maintain or improve the evenness of the silicon oxide gapfill recess operation, while suppressing the damage to the sidewalls. The inventors surmise that the desirable surface modification may depend predominantly on total plasma power whereas sidewall damage depends more on peak plasma power. The choice of helium as a treatment gas may have proven more effective as a result of an increased processing depth into the gapfill silicon oxide. The mechanism for improving the uniformity of the removal rate of the gapfill silicon oxide during the Siconi™ stage may lie in a more even distribution of suitable nucleation sites for formation of the salt by-products even deep within the gapfill material. By way of speculative hypothesis, the etch may progress through the gapfill silicon oxide uncovering suitable nucleation sites which have been nestled within the film by the plasma pretreatment.

Substrate processing region 1040 can be maintained at a variety of pressures during the flow of treatment gases and/or plasma effluents into substrate processing region 1040. During treatment, the treatment pressure may be maintained between about 10 mTorr and about 1000 mTorr, between about 10 mTorr and about 400 mTorr, between about 30 mTorr and about 300 Torr or preferably between about 80 mTorr and about 225 mTorr in disclosed embodiments. The same process pressures may be used during the etch process, however, relatively high pressures are also possible: the etch process pressure may be maintained between about 500 mTorr and about 30 Ton, between about 1 Ton and about 10 Ton or between about 3 Ton and about 6 Torr in disclosed embodiments. Lower pressures may also be used within substrate processing region 1040. The pressure may be maintained below or about 500 mTorr, below or about 250 mTorr, below or about 100 mTorr, below or about 50 mTorr or below or about 20 mTorr in disclosed embodiments.

Dense areas include numerous narrow trenches which may be formed into a layer of material deposited on a substrate or may be formed in the substrate material itself. The substrate material may be silicon, in embodiments, as is the case for shallow trench isolation (STI). The width of the trenches may be less than one of 35 nm, 30 nm, 25 nm, 20 nm or 15 nm, in embodiments of the invention. Open areas often occur near the edges of a chip but may occur anywhere depending on the design of the integrated circuit. An open area has at least one trench with a trench width which is greater than or about 100 nm, greater than or about 300 nm or greater than or about 1 µm. Both trenches in the dense area and the trench in the open area may have a depth which is greater than 100 nm, greater than 200 nm, greater than 400 nm or greater than 1 µm in disclosed embodiments. Local plasma power and treatment pressure in the substrate processing region have been found to modulate the relationship between linear etch rates in the open areas compared to dense areas. For example, the local plasma power and the treatment pressure may be selected such that etching the gapfill silicon oxide removes material in an open area at a linear rate greater than in a dense area. The local plasma power and the treatment pressure may also be selected such that etching the gapfill silicon oxide removes material in a dense area at a linear rate greater than in an open area. Applications of these effects will now be described.

As a result of micro-loading effects during the silicon oxide gapfill deposition, the initial thickness of silicon oxide may vary between the dense and open areas. The local plasma treatment may be tuned to counteract this effect and end up with a substantially even level of remaining material in narrow versus wide trenches. The inventors have found that selecting a relatively high plasma power from the ranges provided and simultaneously selecting a relatively low pressure from the process pressure during the treatment portion of the process results in a removal rate which is faster in the dense areas and slower in the open areas. Selecting a relatively low plasma power in combination with a relatively high process pressure has been found to result in a faster removal rate in the open areas and a slower removal rate in the dense regions. The inventors have been successful in adjusting for even slight deposition micro-loading effects using this technique. Adjusting the process in this way may be referred to herein as tuning the micro-loading of the etch process.

In one or more embodiments, the processing chamber 1001 can be integrated into a variety of multi-processing platforms, including the Producer™ GT, Centura™ AP and Endura™ platforms available from Applied Materials, Inc. located in Santa Clara, Calif. Such a processing platform is capable of performing several processing operations without breaking vacuum. Deposition chambers that may implement embodiments of the present invention may include dielectric etch chambers, high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers.

Embodiments of the deposition systems may be incorporated into larger fabrication systems for producing integrated circuit chips. FIG. 5 shows one such system 1101 of deposition, baking and curing chambers according to disclosed embodiments. In the figure, a pair of FOUPs (front opening unified pods) 1102 supply substrate substrates (e.g., 300 mm diameter wafers) that are received by robotic arms 1104 and placed into a low pressure holding area 1106 before being placed into one of the wafer processing chambers 1108a-f. A second robotic arm 1110 may be used to transport the substrate wafers from the holding area 1106 to the processing chambers 1108a-f and back. Each processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, preclean, degas, orientation and other substrate processes.

The processing chambers 1108a-f may include one or more system components for depositing, annealing, curing and/or etching a flowable dielectric film on the substrate wafer. In one configuration, two pairs of the processing chamber (e.g., 1108c-d and 1108e-f) may be used to deposit dielectric material on the substrate, and the third pair of processing chambers (e.g., 1108a-b) may be used to etch the deposited dielectric. In another configuration, all three pairs of chambers (e.g., 1108a-f) may be configured to etch a dielectric film on the substrate. Any one or more of the processes described may be carried out on chamber(s) separated from the fabrication system shown in disclosed embodiments.

System controller 1157 is used to control motors, valves, flow controllers, power supplies and other functions required to carry out process recipes described herein. A gas handling system 1155 may also be controlled by system controller 1157 to introduce gases to one or all of the processing chambers 1108a-f. System controller 1157 may rely on feedback from optical sensors to determine and adjust the position of movable mechanical assemblies in gas handling system 1155 and/or in processing chambers 1108a-f. Mechanical assemblies may include the robot, throttle valves and susceptors which are moved by motors under the control of system controller 1157.

In an exemplary embodiment, system controller 1157 includes a hard disk drive (memory), USB ports, a floppy disk drive and a processor. System controller 1157 includes analog and digital input/output boards, interface boards and stepper motor controller boards. Various parts of multi-chamber processing system 1101 which contains processing chamber 1001 are controlled by system controller 1157. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for etching, depositing or otherwise processing a film on a substrate or a process for cleaning chamber can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. "Silicon oxide" may include minority concentrations of other elemental constituents such as nitrogen, hydrogen, carbon and the like. Silicon oxide may consist only of silicon and oxygen in disclosed embodiments. A gas may be a combination of two or more gases. The term "trench" is used throughout with no implication that the etched geometry has a large horizontal aspect ratio. Viewed from above the surface, trenches may appear circular, oval, polygonal, rectangular, or a variety of other shapes.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of etching gapfill silicon oxide from a narrow trench on a patterned substrate in a substrate processing region of a substrate processing chamber, the method comprising:

flowing a treatment gas into the substrate processing region;

forming a local plasma from the treatment gas in the substrate processing region, wherein the local plasma is formed by applying a local plasma power and a treatment pressure is maintained in the substrate processing region;

treating the patterned substrate with the local plasma;

combining a hydrogen-containing precursor and a fluorine-containing precursor in a remote plasma region while forming a remote plasma in the remote plasma region to form plasma effluents, wherein the remote plasma is formed by applying a remote plasma power;

flowing the plasma effluents into the substrate processing region;

etching the gapfill silicon oxide below the top of the trench, wherein etching the gapfill silicon oxide occurs after the operation of treating the patterned substrate.

2. The method of claim 1 wherein a width of the narrow trench is less than 35 nm.

3. The method of claim 1 wherein a temperature of the patterned substrate is below 120° C. during the operation of etching the gapfill silicon oxide.

4. The method of claim 1 further comprising repeating the operations of treating the patterned substrate and etching the gapfill silicon oxide until a target thickness of the silicon oxide layer is removed.

5. The method of claim 1 wherein treating the patterned substrate and etching the gapfill silicon oxide removes between 5 nm and 75 nm of gapfill silicon oxide.

6. The method of claim 1 wherein the hydrogen-containing precursor comprises at least one precursor selected from the group consisting of atomic hydrogen, molecular hydrogen and ammonia.

7. The method of claim 1 wherein the fluorine-containing precursor comprises at least one precursor selected from the group consisting of nitrogen trifluoride, hydrogen fluoride, diatomic fluorine, monatomic fluorine and fluorine-substituted hydrocarbons.

8. The method of claim 1 wherein the patterned substrate consists of silicon.

9. The method of claim 1 wherein the treatment gas comprises at least one of ammonia, argon, molecular nitrogen, neon or molecular hydrogen.

10. The method of claim 1 wherein the treatment gas comprises helium.

11. The method of claim 1 wherein the treatment gas consists only of helium.

12. The method of claim 1 wherein the patterned substrate further comprises a wide trench and a width of the wide trench is greater than 100 nm.

13. The method of claim 1 wherein the local plasma power is pulsed at a frequency between 100 Hz and about 10 kHz.

14. The method of claim 1 wherein the local plasma power and the treatment pressure are selected such that etching the gapfill silicon oxide removes material in a dense area at a linear rate greater than in an open area.

15. The method of claim 1 wherein the local plasma power and the treatment pressure are selected such that etching the gapfill silicon oxide removes material in an open area at a linear rate greater than in a dense area.

16. The method of claim 1 wherein the local plasma is capacitively-coupled or inductively-coupled.

17. The method of claim 1 wherein etching the gapfill silicon oxide comprises forming salt by-product on the surface of the patterned substrate.

18. The method of claim 17 further comprising sublimating the salt by-product from the surface by raising a temperature of the substrate above a sublimation temperature.

19. The method of claim 18 wherein the sublimation temperature is greater than 90° C.

* * * * *